US006483343B1

(12) United States Patent
Faith et al.

(10) Patent No.: US 6,483,343 B1
(45) Date of Patent: Nov. 19, 2002

(54) CONFIGURABLE COMPUTATIONAL UNIT EMBEDDED IN A PROGRAMMABLE DEVICE

(75) Inventors: Brian C. Faith, Santa Clara, CA (US); Thomas Oelsner, Wey Bridge (GB); Gary N. Lai, Sunnyvale, CA (US)

(73) Assignee: QuickLogic Corporation, Sunnyvale, CA (US)

( * ) Notice: Subject to any disclaimer, the term of this patent is extended or adjusted under 35 U.S.C. 154(b) by 0 days.

(21) Appl. No.: 09/751,538

(22) Filed: Dec. 29, 2000

(51) Int. Cl.[7] ............................................. H03K 19/177
(52) U.S. Cl. ............................. 326/40; 326/38; 326/41; 326/39; 708/523; 708/625
(58) Field of Search ...................... 326/37–41; 708/625, 708/523, 632

(56) References Cited

U.S. PATENT DOCUMENTS

| | | | | |
|---|---|---|---|---|
| 5,847,981 A | * | 12/1998 | Kelley et al. ............ | 364/750.5 |
| 5,941,940 A | * | 8/1999 | Prasad et al. ................ | 708/523 |
| 6,092,094 A | * | 7/2000 | Ireton .......................... | 708/706 |
| 6,140,839 A | * | 10/2000 | Kaviani et al. ................ | 326/39 |
| 6,152,838 A | * | 11/2000 | Wittig et al. .................. | 326/39 |
| 6,154,049 A | * | 11/2000 | New ............................. | 326/39 |

* cited by examiner

Primary Examiner—Michael Tokar
Assistant Examiner—Vibol Tan
(74) Attorney, Agent, or Firm—Skjerven Morrill LLP

(57) ABSTRACT

A plurality of configurable computational units are embedded in a programmable device, such as a field programmable gate array. Each configurable computational unit includes an adder circuit that is switchably coupled to a multiplier circuit and an accumulator circuit. The configurable computational unit may be configured permanently or on-the-fly to perform desired arithmetic type functions efficiently and effectively. For example, the computational unit may be configured for digital signal processing functions, filtering functions, and algorithm functions. The computational units may be cascaded by programmably connecting the computational units together, e.g., through the routing resources of the programmable device.

21 Claims, 8 Drawing Sheets

US 6,483,343 B1

CONFIGURABLE COMPUTATIONAL UNIT EMBEDDED IN A PROGRAMMABLE DEVICE

FIELD OF THE INVENTION

This invention relates to programmable logic devices. More particularly, this invention relates to a field programmable gate array (FPGA) employing, e.g., antifuses, with an embedded configurable computational unit.

BACKGROUND

A programmable logic device is a versatile integrated circuit chip, the internal circuitry of which may be configured by an individual user to realize a user-specific circuit. To configure a programmable logic device, the user configures an on-chip interconnect structure so that selected input terminals and selected output terminals of selected on-chip circuit components are electrically connected together in such a way that the resulting circuit is the user-specific circuit desired by the user. Programmable logic devices employ between selected wire segments, e.g., amorphous silicon antifuses that are "programmed" to connect the selected wire segments together electrically. Which antifuses are programmed and which antifuses are left unprogrammed determines how the circuit components are interconnected and therefore determines the resulting circuit.

A field programmable gate array (an "FPGA") is one type of programmable logic device. For background information on field programmable gate arrays employing antifuses, see: "Field Programmable Gate Array Technology" edited by Stephen Trimberger, 1994, pages 1–14 and 98–170; "Field-Programmable Gate Arrays" by Stephen Brown et al., 1992, pages 1–43 and 88–202; "Practical Design Using Programmable Logic" by David Pellerin and Michael Holley, 1991, pages 84–98; the 1995 QuickLogic Data Book, 1995, pages 1–5 through 2–11 and 6–3 through 6–18; the 1995 Actel FPGA Data Book And Design Guide, 1995, pages ix–xv, 1–5 through 1–34, 1–51 through 1–101, 1–153 through 1–222, 3–1 through 4–56; U.S. Pat. No. 5,424,655 entitled "Programmable Application Specific Integrated Circuit Employing Antifuses and Methods Therefor"; U.S. Pat. No. 5,825,201 entitled "Programming Architecture for a Programmable Integrated Circuit Employing Antifuses." The contents of these documents are incorporated herein by reference.

SUMMARY

A plurality of configurable computational units is embedded in a programmable device, such as a field programmable gate array, in accordance with the present invention. Each configurable computational unit includes an adder circuit that is switchably coupled to a multiplier circuit and an accumulator circuit via, e.g., multiplexers. The configurable computational unit may be configured permanently or on the fly to perform desired arithmetic type functions efficiently and effectively. For example, the computational unit may be configured for digital signal processing functions, filtering functions, and algorithm functions. The computational units may be cascaded by programmably connecting the computational units together, e.g., through the routing resources of the programmable device.

DETAILED DESCRIPTION

Figure 1:
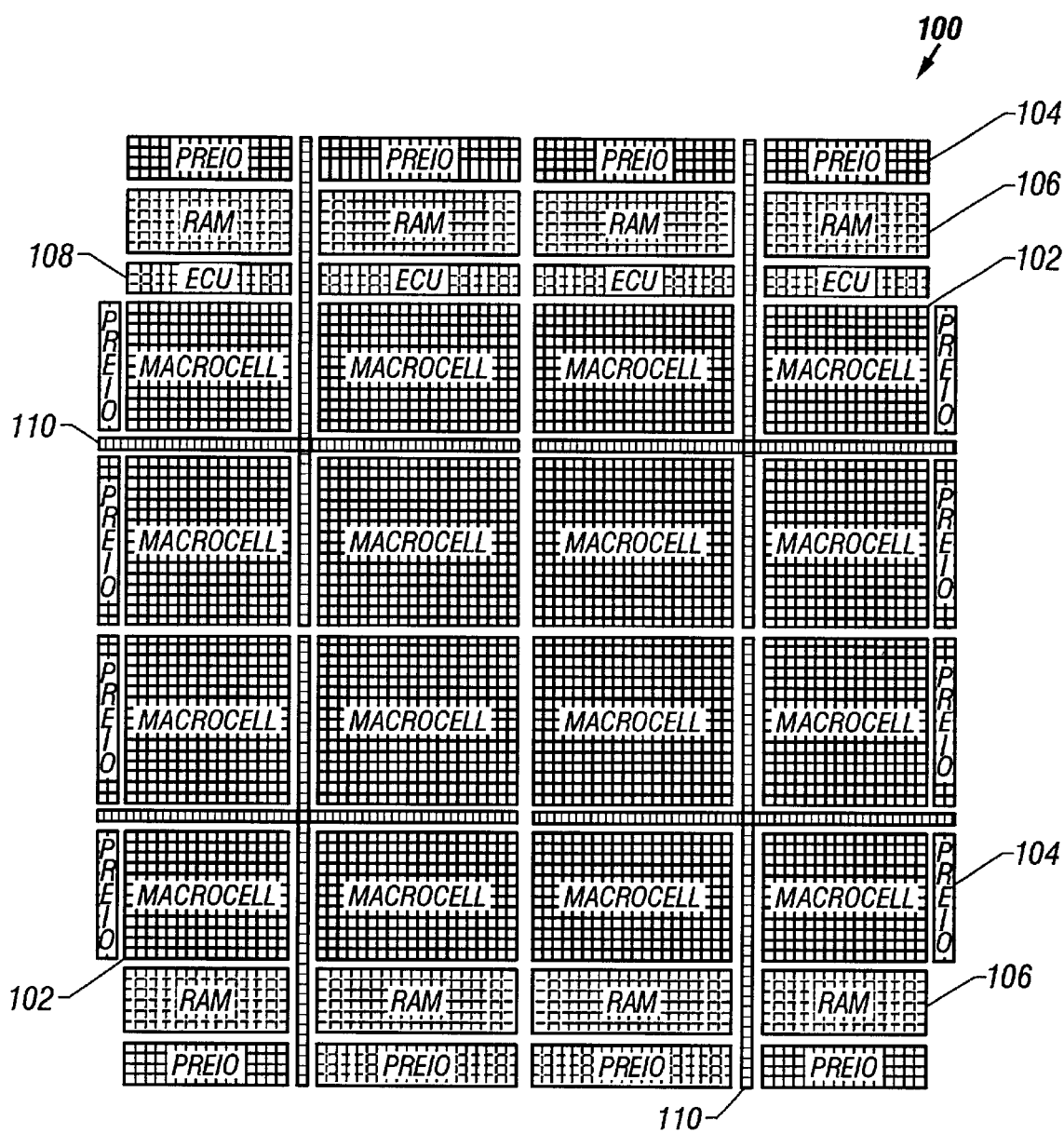
FIG. 1 is a schematic view of a programmable logic device, in the form of a field programmable gate array (FPGA) that includes a plurality of macrocells, I/O cells, RAM cells and embedded computational units (ECUs).

FIG. 1 is a schematic view of a programmable logic device, in the form of a field programmable gate array (FPGA) 100 that includes a plurality of macrocells 102 and I/O (PREIO) cells 104, a plurality of RAM cells 106 and embedded computational units (ECUs) 108. In addition, as shown in FIG. 1, FPGA 100 includes horizontal and vertical programming shift registers 110, which are used for programming the desired interconnections within FPGA 100. The architecture of FPGA 100 is described in greater detail in co-pending and co-filed U.S. patent application entitled "Architecture For Field Programmable Gate Array", by R. Fu et al. having Ser. No. 09/751,440, which has the same assignee as the present disclosure and is herein incorporated by reference.

The ECUs 108 are configurable multiply-add-accumulate circuits that address arithmetic type functions efficiently and effectively. ECUs 108 may be used, e.g., for digital signal processing (DSP) functions, filtering functions, and algorithm functions. ECUs 108 are configurable, either permanently, e.g., using programmable antifuses, or on the fly, e.g., using multiplexers. Thus, ECUs 108 operate as configurable arithmetic logic units within the FPGA 100. Conventionally, when a programmable logic device is to perform distributed types of arithmetic with one or both numbers changing, a look up table is used. A look-up-table, however, utilizes a large amount of resources in a programmable logic device, which is undesirable. Thus, ECU 108 maybe used to perform the desired function with a reduction in the required resources.

Figure 2:
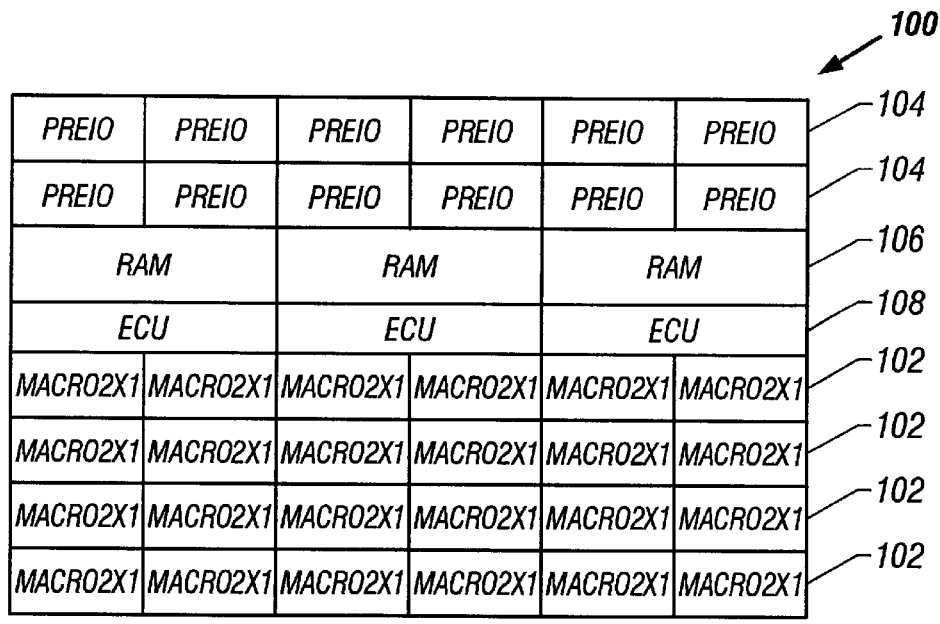
FIG. 2 is a more detailed portion of the programmable logic device of FIG. 1.

As shown in FIG. 1, ECUs 108 are located between the RAM cells 106 and the macrocells 102 along the top half FPGA 100. FIG. 2 is a more detailed portion of FPGA 100, showing each ECU block 108 spans across one RAM cell 106 and two macrocells 102, where each macrocell 102 contains two logic cells along with supporting routing resources and is therefore a 2×1 macrocell. An FPGA 100 may have a plurality of ECUs 108, e.g., 10 to 28, depending on the size of the FPGA 100 and the number of macrocells 102. Of course, any number of ECUs 108 may be included on FPGA 100. Further, the ECUs 108 may be located elsewhere or in additional locations on FPGA 100. ECUs 108 may have any desired span, e.g., ECU 108 may span any desired number of macrocells 102 and RAM cells 106.

Figure 3:
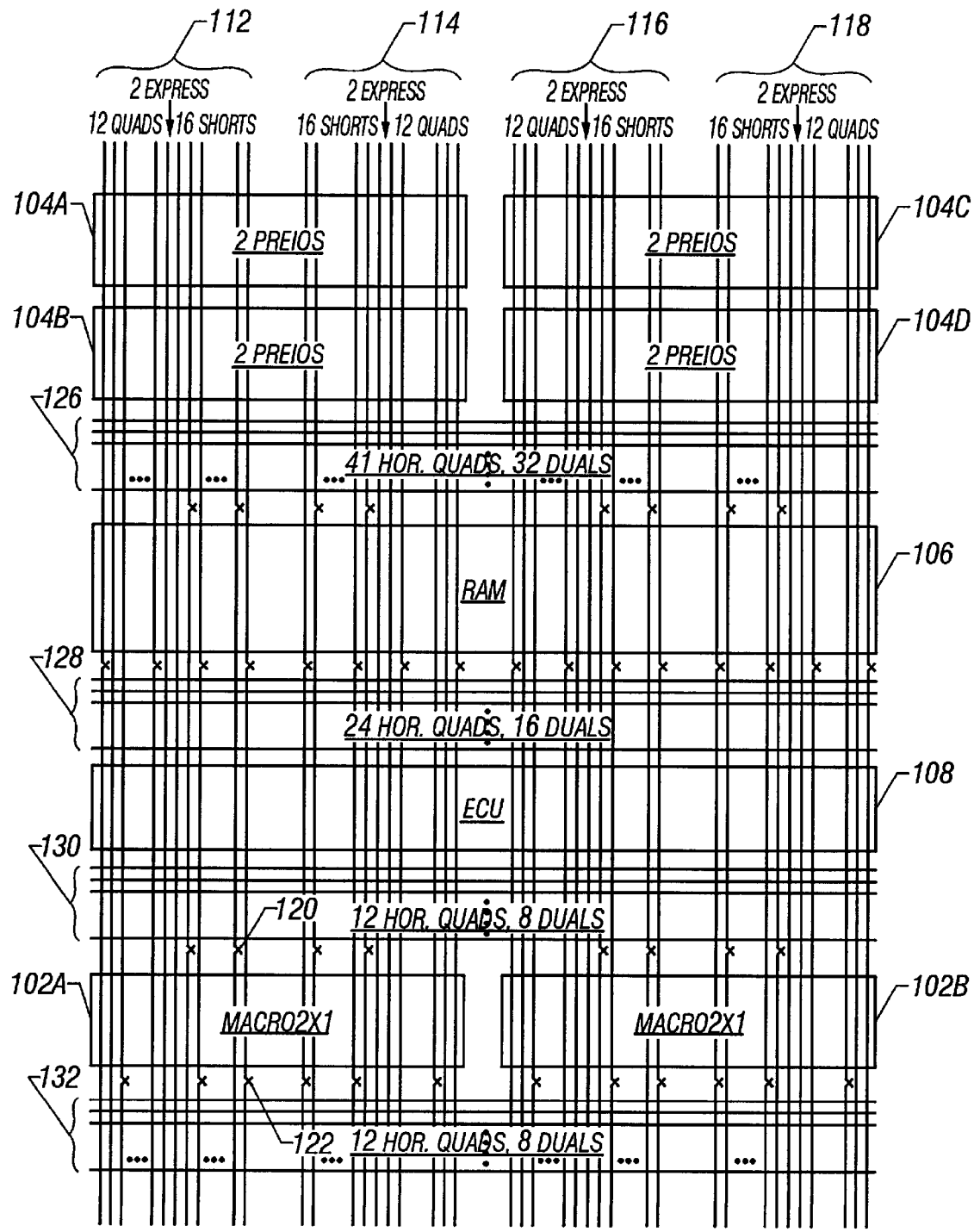
FIG. 3 shows the routing resources and possible interconnections between macrocells, I/O cells, a RAM cell, and an ECU.

FIG. 3 shows the routing resources and possible interconnections between macrocells 102, I/O cells 104, RAM cell 106, and an ECU 108. FIG. 3 shows four I/O (preio) cells 104A, 104B, 104C, and 104D, where each I/O cell includes two I/O circuits. FIG. 3 also shows two macrocells 102A and 102B. Vertical routing resources 112 and 114 pass through I/O cells 104A and 104B and macrocell 102A, while vertical routing resources 116 and 118 pass through I/O cells 104C and 104D and macrocell 102B. As shown in FIG. 3, the vertical routing resources 112, 114, 116, and 118 all pass through RAM cell 106 and ECU 108.

Each group of vertical routing resources, e.g., routing resource 112, includes a plurality of short lines, e.g., sixteen, a plurality of quad lines, e.g., twelve, and a plurality of express lines, e.g., two. Short lines include pass links, e.g., antifuses 120 and 122, between macrocells. The pass links are programmable, where in the unprogrammed state, the link provides an open circuit and in the programmed stated the link provides a closed circuit. A particularly suitable type of link is an amorphous silicon antifuse such as that disclosed in U.S. Pat. No. 5,502,315, entitled "Electrically Programmable Interconnect Structure a Having PECVD Amorphous Silicon Element" and U.S. Ser. No. 09/196,946, entitled "Metal-To-Metal Antifuse With Non-Conductive Diffusion Barrier" filed Nov. 19, 1998. by Shroff et al., which have the same assignee as the present disclosure and are hereby incorporated by reference. Other types of programmable elements may be used as well, e.g., SRAM.

As shown in FIG. 3, the pass links are staggered, so that half the pass links are before the macrocell, illustrated by antifuse 120 above macrocell 102A, and half the pass links are after the macrocell, illustrated by antifuse 122 below macrocell 102A. The pass links are also staggered relative to the RAM cell 106. If desired, pass links may also be staggered relative to ECU 108. The quad lines in the routing resources, e.g., routing resource 112, are similar to short lines, but include pass links between every four macrocells 102, which are not shown in FIG. 3 for the sake of simplicity. Express lines within the routing resources extend from one side of the FPGA to the other without pass links.

FIG. 3 also shows a number of horizontal routing resources, which include a number of horizontal quad lines and dual lines, dual lines are similar to short lines, but a dual line is a horizontal line that fully spans to logic cells. If desired, horizontal express lines may also be included in the horizontal routing resources. Horizontal routing resources 126 are located between the I/O cells 104 and the RAM cell 106 and include, e.g., thirty two dual lines and forty-one quad lines. Horizontal routing resources 128 are located between the RAM cell 106 and the ECU 108 and include, e.g., sixteen dual lines and twenty-four quad lines. Horizontal routing resources 130 and 132 are respectively located between the ECU 108 and the array of macrocells, and between one row macrocells and the next row of macrocells (not shown in FIG. 3). Horizontal routing resources 130 and 132 include, e.g., eight dual lines and twelve quad lines. The horizontal dual lines and quad lines are similar to the vertical dual lines and quad lines described above.

In addition to pass links used in the, short, dual and quad lines, cross-links are located at approximately every intersection between the vertical routing resources and the horizontal routing resources and are programmable to provide desired interconnections. The cross-links, which similar to pass links may be, e.g., antifuses, are not shown in FIG. 3 for the sake of simplicity. In addition, cross links may be used within the various cells, e.g., macrocells 102, I/O cells 104, RAM cell 106 and ECU 108 to programmably couple the vertical routing resources to the circuitry within the cell.

Several ECUs 108 may be linked together by programming cross-links between appropriate vertical and horizontal routing resources. Thus, ECUs 108 are cascadable.

It should be understood that if desired, routing resources may be programmed to by-pass ECUs 108 if desired. Thus, if a computational unit is not required by the user, the ECUs 108 are not utilized. Further, the manufacturer may mask out user access to the ECUs 108, e.g., using software. Masking out sections of an FPGA using software is discussed in more detail in U.S. Ser. No. 09/343,980, entitled "Virtual Programmable Device And Method Of Programming", filed Jun. 30, 1999, by S. Mahajan et al., which has the same assignee as the present disclosure and is incorporated herein by reference. With the ECUs 108 masked out, the user will not have access to ECUs 108. Consequently, FPGA 100 may be sold as both an FPGA 100 with ECUs 108 as well as an FPGA 100 without ECUs 108.

Figure 4:
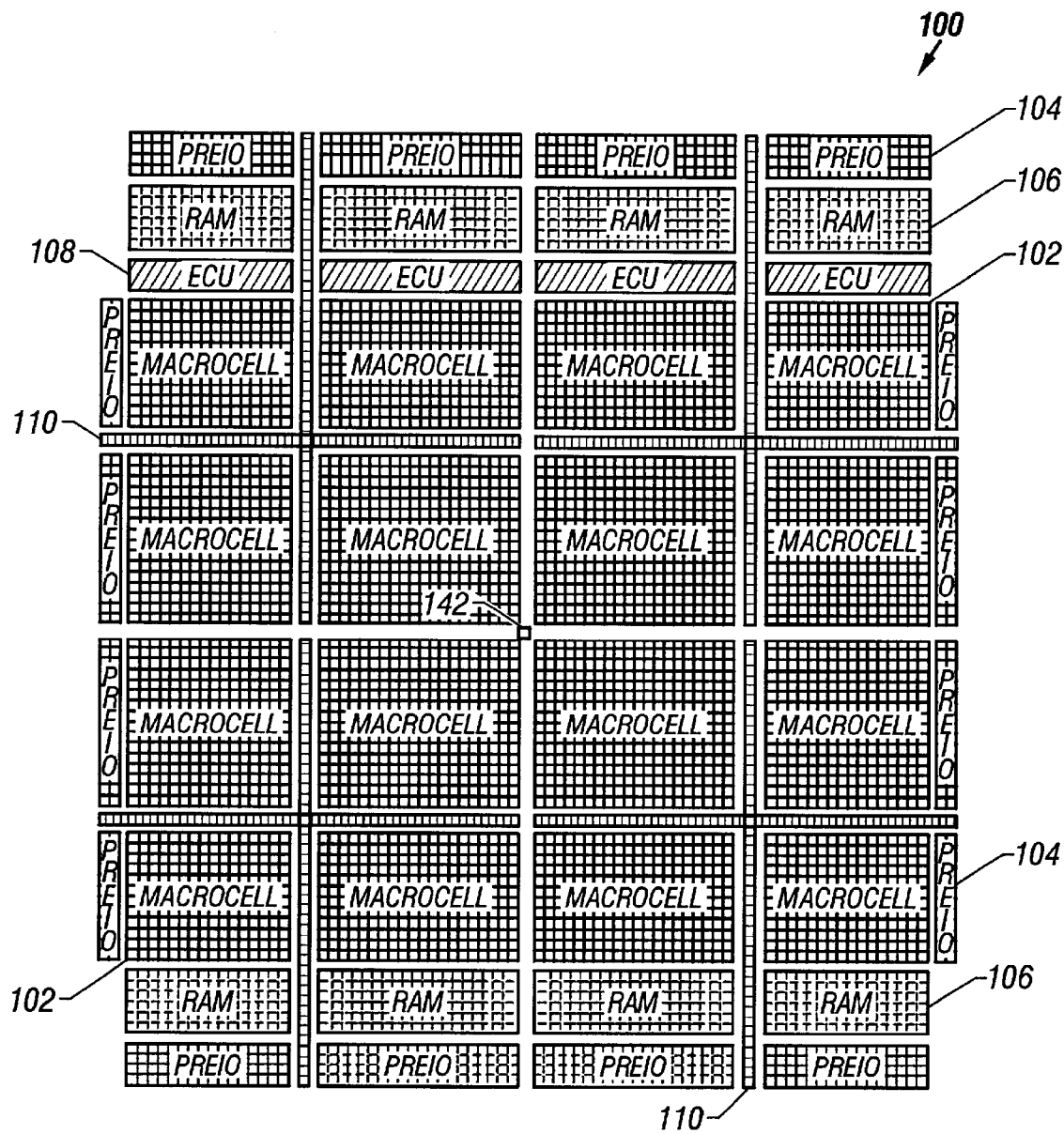
FIG. 4 is a schematic view of a programmable logic device, similar to that shown in FIG. 1, that includes a plurality of macrocells, I/O cells, RAM cells and embedded computational units (ECUs) that are restricted from use based on signatures bits.
Figure 5A:
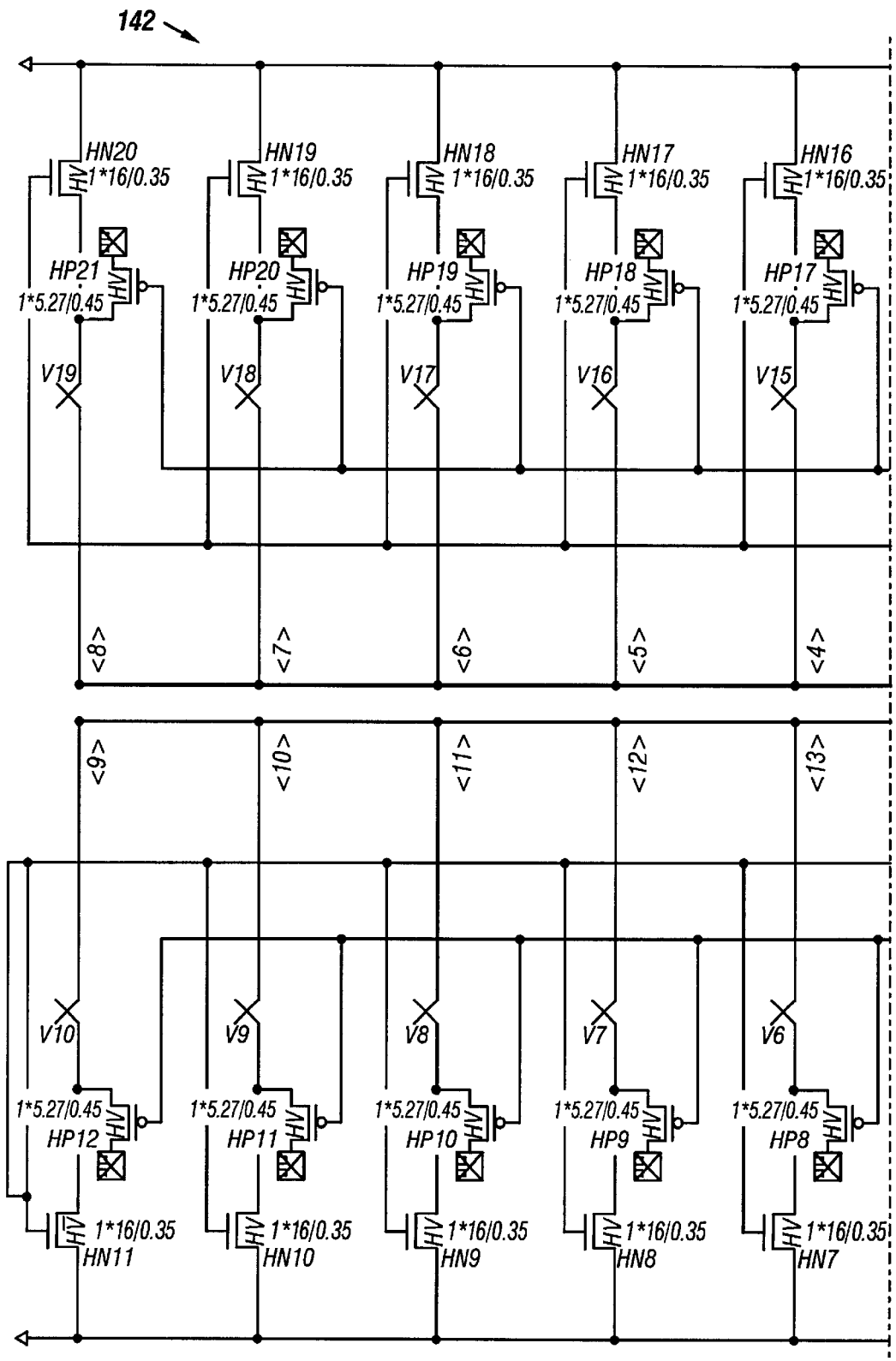
FIGS. 5A and 5B, shows a schematic view of one embodiment of the signature bits cell that may be used to define programmable logic device as ECU accessible or inaccessible.
Figures 5, 5B:
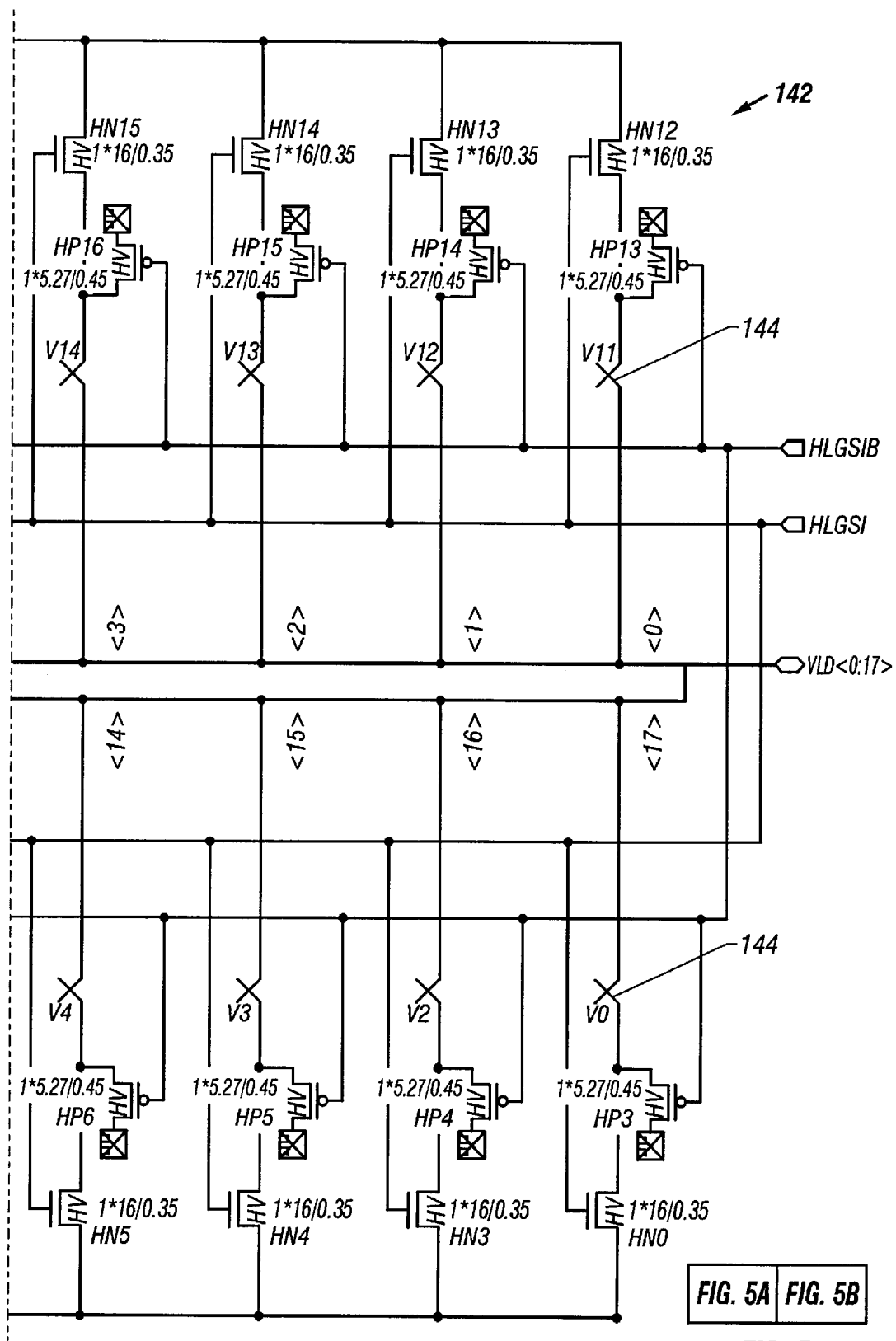
FIG. 5, which includes

FIG. 4 is similar to FIG. 1, and is a schematic view of a programmable logic device 140 that includes a plurality of macrocells 102 and I/O (PREIO) cells 104, a plurality of RAM cells 106, embedded computational units (ECUs) 108, and signature bits cell 142 that can be programmed by the manufacturer to restrict access to ECUs 108. Thus, when signature bits cell 142 is properly programmed, ECUs 108 will be inaccessible to a user, as indicated by shading in ECUs 108 in FIG. 4. FIG. 5 shows a schematic view of one embodiment of the signature bits cell 142 that may be used to define programmable logic device 140 as ECU 108 accessible or inaccessible. Signature bits cell 142 includes a plurality of antifuses 144 that may be programmed by the manufacturer. During programming of the programmable logic device 140 by the user, the progranmming unit used to program device 140 reads the signature bits cell 142 and either permits or denies the user access to ECUs 108. For more information regarding masking out ECUs and portions of an FPGA, in general, the readers attention is directed to U.S. Ser. No. 09/343,980, which is incorporated by reference.

Figure 6:
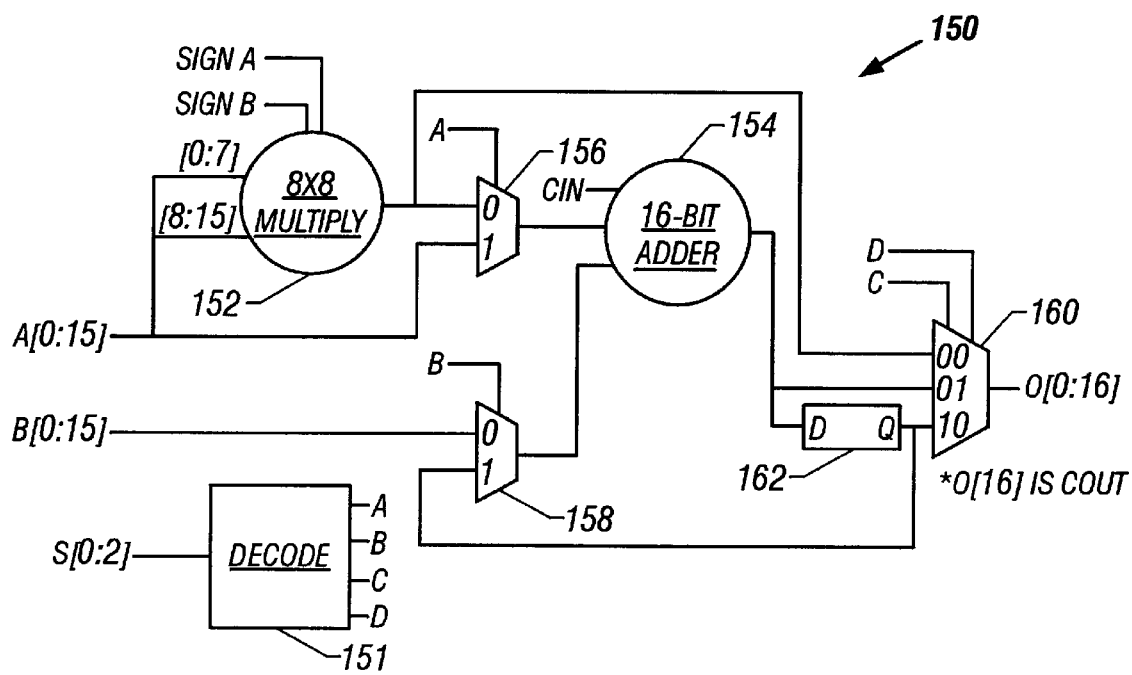
FIG. 6 is a block diagram of a multiply-add-accumulate circuit that may be used as the ECU shown in FIG. 1, in accordance with an embodiment of the present invention.

FIG. 6 is a block diagram of multiply-add-accumulate circuit 150 that may be used as ECU 108 shown in FIG. 1, in accordance with an embodiment of the present invention. Multiply-add-accumulate circuit 150 includes an m×n multiply circuit 152, which may be e.g., an 8×8 multiply circuit, a 16-bit adder circuit 154, multiplexers 156, 158, and 160, as well as an output register 162 that can be switchably coupled to 16-bit adder circuit 154 to serve as an accumulate circuit. Thus, as shown in FIG. 6, the 16-bit adder circuit is switchably coupled to the 8×8 multiply circuit and the accumulate circuit.

As shown in FIG. 6, multiply-add-accumulate circuit 150 has an input terminal A[0:15] that provides the addend inputs of the 16-bit adder circuit 154 via multiplexer 156 or the multiplicand A[0:7] and multiplier A[8:15] of the 8×8 multiplier circuit 152. The data inputs of multiplexer 156 are coupled to the output terminal of the 8×8 multiplier circuit 152 and the input terminal A[0:15]. The output terminal of multiplexer 156 is coupled to one input terminal of the 16-bit adder circuit 154. Thus, multiplexer 156 is used to select whether the 16-bit adder circuit 154 receives the input data A[0:15] directly or the product from the 8×8 multiplier circuit 152. The 8×8 multiplier circuit 152 can perform unsigned multiplication with 8-bit operands or signed multiplication with 8-bit operands, where the eighth bit and most significant bit (MSB) is a sign bit. The 8×8 multiplier circuit 152 also includes two sign terminals (sign A and sign B), which provide a signal to configure the 8×8 multiplier circuit 152 for true multiplication of two 8-bit signed numbers, true multiplication of two 8-bit unsigned numbers, or true multiplication of one 8-bit signed number and one 8-bit unsigned number. It should be understood that the 8×8 multiply circuit 152 may use any desired number of bits, m and n, as the multiplicand and multiplier.

A second input terminal B[0:15] is coupled to one data terminal of a second multiplexer 158. The output terminal of the multiplexer 158 is coupled to a second input terminal of the 16-bit adder circuit 154. Thus, the data on input terminal B[0:15] is provided to the 16-bit adder circuit 154 as the adder inputs through a multiplexer 158. The 16-bit adder circuit 154 also includes a carry-in (Cin) terminal, which provides the carry-in bit for the 16-bit adder circuit 154.

Multiplexer 160 includes a first data input terminal directly coupled to the output terminal of the 8×8 multiplier circuit 152, a second data input terminal directly coupled to the output terminal of the 16-bit adder circuit 154, and a third data input terminal coupled to the output terminal of the 16-bit adder circuit 154 via register 162. Multiplexer 160 provides the output O[0:16] of the multiply-add-accumulate circuit 150, where the last bit O[16] is the carry-out bit from the 16-bit adder circuit 154.

The output terminal of output register 162 is coupled to the second data terminal of multiplexer 158. Thus, the output data of register 162 may be provided to 16-bit adder circuit 154 through multiplexer 158, thereby serving as an accumulator circuit.

As can be seen from FIG. 6, multiply-add-accumulate circuit 150 has multiple modes of operation. The modes of operation of multiply-add-accumulate circuit 150 are shown in Table 1 below.

TABLE 1

| Modes of Operation | A | B | C | D | No. of inputs | No. of outputs |
|---|---|---|---|---|---|---|
| Multiply | 0 | 0 | 0 | 0 | 16 (A[0:15]) | 17 |
| Multiply (registered output) | 0 | 0 | 1 | 0 | 16 (A[0:15]) | 17 |
| Add | 1 | 0 | 0 | 1 | 33 (A[0:15], B[0:15], Cin) | 17 |
| Add (registered output | 1 | 0 | 1 | 0 | 33 (A[0:15], B[0:15], Cin) | 17 |
| Accumulate | 1 | 1 | 1 | 0 | 16 (A[0:15]) | 17 |
| Multiply-Add | 0 | 0 | 0 | 1 | 33 (A[0:15], B[0:15], Cin) | 17 |
| Multiply-Add (registered output) | 0 | 0 | 1 | 0 | 33 (A[0:15], B[0:15], Cin) | 17 |
| Multiply-Accumulate | 0 | 1 | 1 | 0 | 16 (A[0:15]) | 17 |

Where terminal A is the select terminal of multiplexer 156, terminal B is the select terminal of multiplexer 158, and terminals C and D are the select terminals of multiplexer 160. The multiply with a registered output function is achieved by adding zero, (e.g., tie B[0:15] to ground) to the product from the 8×8 multiply circuit 152 at the 16-bit adder circuit 154.

Advantageously, multiply-add-accumulate circuit 150 may be configured such that the 8×8 multiply circuit 152 performs as a 16×16, or larger, multiply circuit. For example, through the use of the multiply accumulate function, 8×8 multiply circuit 152 and by altering the input data A[0:15] per each clock cycle, the 8×8 multiply circuit 152 can function as a 16×16, or larger, multiply circuit. In addition, a plurality of multiply-add-accumulate circuits 150 may be cascaded together, e.g., through appropriate routing resources and optional use of programmable logic resources to perform a 16×16, or larger, multiply function.

Advantageously, the function performed by multiply-add-accumulate circuit 150 may be permanently programmed or may be altered on the fly. As shown in FIG. 6 and in Table 1, the function to be performed by multiply-add-accumulate circuit 150 is controlled by select terminals A, B, C, and D. Select terminals A, B, C, and D are decoded from a three bit instruction signal S[0:2] that is received by decode circuit 151. Decode circuit 151 includes an appropriate set of logic gates to produce the desired output on selected terminals A, B, C, and D based on the instruction signal S[0:2], which is well understood by those skilled in the art. The instruction signals S[0:2] may be hardwired, i.e., programmably coupled to Vcc or ground by an antifuse, e.g., with routing resources shown in FIG. 3, or may be coupled to a multiplexer, e.g., within a macrocell 102, or register, combinatorial logic, pin, RAM cell, etc., which can be controlled to alter instruction signals S[0:2], thereby altering the function performed by multiply-add-accumulate circuit on the fly.

Figure 7:
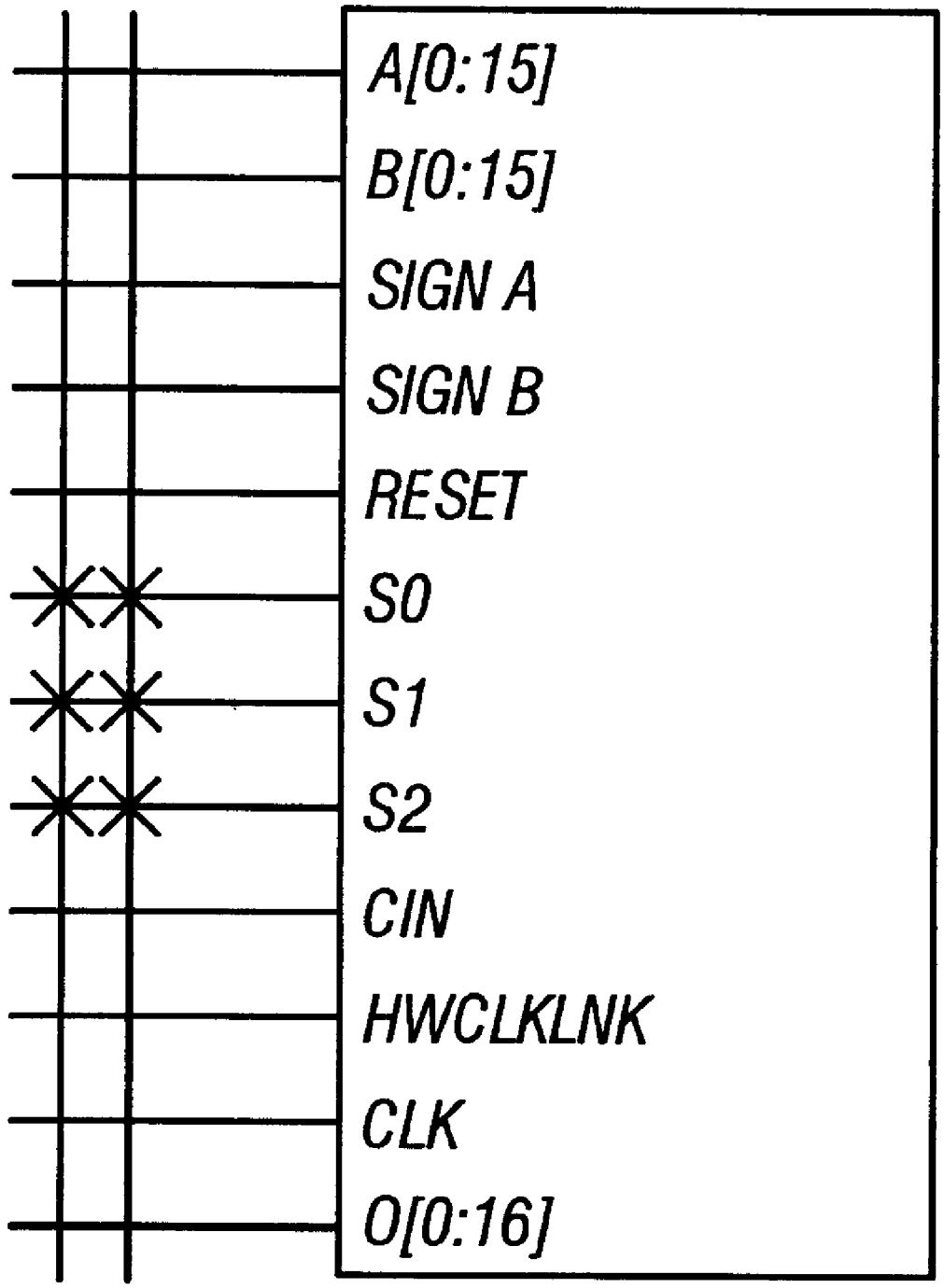
FIG. 7 shows a high level view of multiply-add-accumulate circuit with its input and output terminals.

FIG. 7 shows a high level view of multiply-add-accumulate circuit 150 with its input and output terminals and shows possible interconnections of input terminals S0, S1, and S2 and Vcc and ground. The Clk terminal receives the clock signal and the reset terminal receives the reset signal, both of which are used for the output register and the accumulation operation. The Hwclklnk terminal receives a signal selecting either a hard-wired clock. Some embodiments of the present invention may not include a Hwclklnk terminal.

Figure 8:
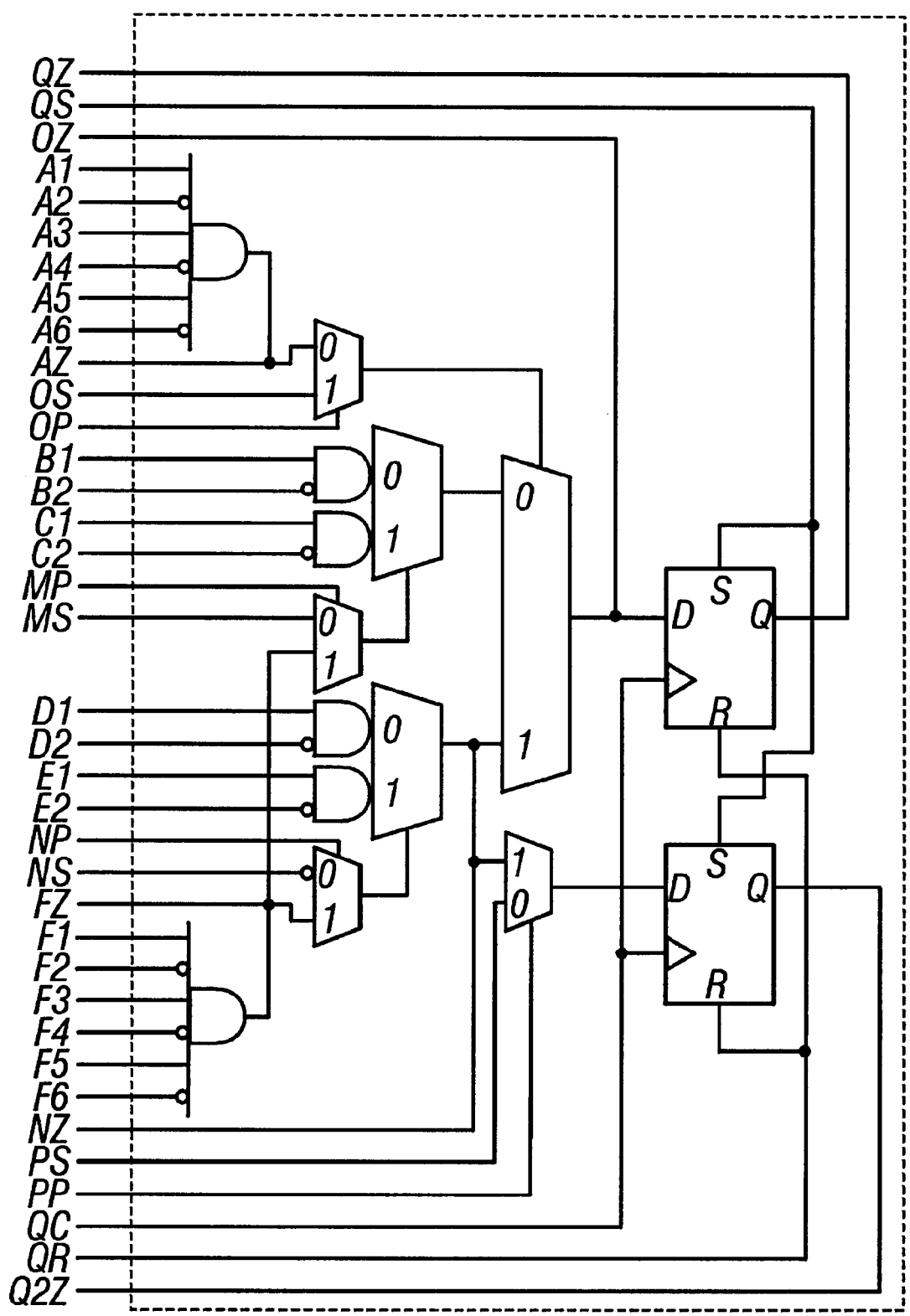
FIG. 8 shows one embodiment of a macrocell that may be used in the programmable logic device of FIG. 1.

FIG. 8 shows one embodiment of macrocell 102, with output terminals QZ, QZ2, QZ, AZ, FZ, NZ, and Q2Z, which may be programmably coupled to input terminals S0, S1, and S2 of multiple-add-accumulate circuit 150, shown in FIG. 7. One embodiment for decoding the instructions signals on input terminals S0, S1, and S2 to generate the desired signal on select terminals A, B, C, and D, is shown in Table 2, shown below.

TABLE 2

| S0 | S1 | S3 | A | B | C | D |
|---|---|---|---|---|---|---|
| 0 | 0 | 0 | 0 | 0 | 0 | 0 |
| 0 | 0 | 1 | 0 | 0 | 0 | 1 |
| 0 | 1 | 0 | 1 | 1 | 1 | 0 |
| 0 | 1 | 1 | 1 | 0 | 0 | 1 |
| 1 | 0 | 0 | 0 | 0 | 1 | 0 |
| 1 | 0 | 1 | 0 | 0 | 1 | 0 |
| 1 | 1 | 0 | 0 | 1 | 1 | 0 |
| 1 | 1 | 1 | 1 | 0 | 1 | 0 |

The decoding of instruction signals S[0:2] may be performed by appropriate logic gates, as is well known by those of ordinary skill in the art. Of course, other decoding methods are possible. In addition, if desired the select terminals A, B, C, and D, may be the instruction terminals themselves, thereby obviating the need to decode instruction signals S[0:2] within ECU 108.

In addition, ECU 108 may include a built-in self test circuit. Thus, for example, where multiply-add-accumulate circuit 150 is used as ECU 108, when in test mode the input data A[0:15] and B[0:15] are driven by a counter. The input data A[0:15] is increased and the input data B[0:15] is decreased, while the output 0[0:16] is examined at each increment. The process is then reversed with the input data A[0:15] is decreased and the input data B[0:15] is increased, again examining the output 0[0:16] at each increment. In this manner, the operation of each ECU 108 may be examined, e.g., by the manufacturer prior to distribution to customers.

Although the present invention is described in connection with certain specific embodiments for instructional purposes, the present invention is not limited thereto. The depictions of the various structures in the various diagrams are illustrative. Aspects of the present invention are not limited to amorphous silicon antifuses and oxide-nitride-oxide antifuses, but rather extend to other antifuse structures. Further, is should be understood that conductive routing resources can be made of any suitable conductive material or combination of materials and need not be made of metal. Moreover, it should be understood that other programmable elements, such as SRAM, may be used in accordance with the present invention if desired. Accordingly, various modifications, adaptations, and combinations of various features of the described embodiments can be practiced without departing from the scope of the invention as defined in the following claims.

What is claimed is:

1. A programmable logic device, comprising:
    a plurality of input/output cells;
    an array of macrocells;
    a plurality of routing resources that programmably couple said macrocells and said input/output cells; and
    at least one configurable computational unit programmably coupled to said routing resources, said configurable computational unit comprising at least an adder circuit and a multiply circuit.

2. The programmable logic device of claim 1, wherein said configurable computational unit further comprises an accumulate circuit.

3. A programmable logic device, comprising:
    a plurality of input/output cells;
    an array of macrocells;
    a plurality of routing resources that programmably couple said macrocells and said input/output cells; and
    at least one configurable computational unit programmably coupled to said routing resources, said configurable computational unit comprising:
        at least an adder circuit and a multiply circuit; and
        said adder circuit switchably coupled to said multiply circuit and an accumulate circuit.

4. The programmable logic device of claim 3, wherein said multiply circuit is switchably coupled to said accumulate circuit.

5. The programmable logic device of claim 3, said configurable computational unit further comprising:
    a first input terminal coupled to said multiply circuit and switchably coupled to said adder circuit;
    a second input terminal switchably coupled to said adder circuit;
    said accumulate circuit comprises a register switchably coupled to said adder circuit; and
    an output terminal switchably coupled to said multiply circuit, said adder circuit and said register.

6. The programmable logic device of claim 5, wherein said multiply circuit comprises a multiplicand terminal and a multiplier terminal, said first input terminal of said configurable computational unit is coupled to said multiplicand terminal and said multiplier terminal.

7. The programmable logic device of claim 6, wherein said first input terminal of said configurable computational unit is split to provide said multiplicand terminal with m bits and said multiplier terminal with n bits.

8. The programmable logic device of claim 1, wherein said configurable computational unit having a plurality of instruction terminals that are programmably coupled to said routing resources, said instruction terminals receiving signals for configuring said configurable computational unit.

9. The programmable logic device of claim 1, wherein said configurable computational unit spans the length of at least four logic cells.

10. The programmable logic device of claim 3, wherein said configurable computational unit further comprises a register coupled to said adder circuit and an output terminal that is switchably coupled to said multiply circuit, said adder circuit, and said register.

11. The programmable logic device of claim 1, comprising a plurality of configurable computational units, wherein said plurality of configurable computational units are programmably coupled together through said routing resources.

12. An apparatus comprising:
    a field programmable gate array;
    a plurality of configurable computational units embedded within said field programmable gate array, each of said configurable computational units having an adder circuit switchably coupled to an m×n multiply circuit and an accumulator circuit.

13. The apparatus of claim 12, wherein each of said configurable computational units further comprises an output terminal switchably coupled to said m×n multiply circuit, said adder circuit and said accumulator circuit.

14. An apparatus comprising:
    a field programmable gate array;
    a plurality of configurable computational units embedded within said field programmable gate array, each of said configurable computational units comprises:
        an adder circuit switchably coupled to an m×n multiply circuit and an accumulator circuit;
        a first input terminal for receiving a first set of data;
        said m×n multiply circuit having a multiplicand terminal coupled to said first input terminal, a multiplier terminal coupled to said first input terminal, and an output terminal, said multiplicand receiving m bits of data from said first set of data and said multiplier terminal receiving n bits of data from said first set of data;
        a first multiplexer circuit having a first data terminal coupled to said output terminal of said m×n multiply circuit, a second data terminal coupled to said first input terminal, an output terminal, and a select terminal; and
        said adder circuit having a first input terminal coupled to said output terminal of said first multiplexer circuit, and having a second input terminal and an output terminal.

15. The apparatus of claim 14, wherein each of said configurable computational units further comprises:
    a second input terminal for receiving a second set of data;
    a second multiplexer circuit having a first data terminal coupled to said second input terminal, a second data terminal, an output terminal coupled to said second input terminal of said adder circuit, and a select terminal;
    a register having an input terminal coupled to said output terminal of said adder circuit, said register having an output terminal coupled to said second data terminal of said second multiplexer circuit; and a third multiplexer having a first data terminal coupled to said output terminal of said m×n multiply circuit, a second data terminal coupled to said output terminal of said adder circuit, a third data terminal coupled to said output terminal of said register, a pair of select terminals, and an output terminal.

16. The apparatus of claim 12, wherein said field programmable gate array comprises a of input/output cells, an array of macrocells, and a plurality of routing resources, each of said configurable computational units further comprising instruction terminals programmable coupled to macrocells and said input/output cells, said instruction terminals receiving signals indicating the desired configuration of said configurable computational unit.

17. The apparatus of claim 12, wherein the plurality of configurable computational units are programmably coupled together.

18. The apparatus of claim 12, further comprising a means for permanently configuring a configurable computational unit to perform a desired function and a means for temporarily configuring said configurable computation unit to perform a desired function.

19. A programmable logic device, comprising:
a plurality of input/output cells;
an array of macrocells;
a plurality of routing resources that programmably couple said macrocells and said input/output cells; and
a plurality of configurable computational units embedded within said programmable logic device and programmably coupled to said routing resources, wherein said configurable computational units are restricted from use when said programmable logic device is a virtual device.

20. The programmable logic device of claim 19, wherein said configurable computational unit comprises an adder circuit switchably coupled to a multiply circuit and an accumulate circuit.

21. The programmable logic device of claim 20, wherein said multiply circuit is switchably coupled to said accumulate circuit.

* * * * *